US007541888B2

(12) United States Patent
Wu et al.

(10) Patent No.: US 7,541,888 B2
(45) Date of Patent: Jun. 2, 2009

(54) DUAL BAND COUPLED-LINE BALANCED-TO-UNBALANCED BANDPASS FILTER

(75) Inventors: Ke-Li Wu, Shatin (HK); Lap Kun Yeung, Shatin (HK)

(73) Assignee: The Chinese University of Hong Kong, Shantin (HK)

( * ) Notice: Subject to any disclaimer, the term of this patent is extended or adjusted under 35 U.S.C. 154(b) by 250 days.

(21) Appl. No.: 11/690,393

(22) Filed: Mar. 23, 2007

(65) Prior Publication Data

US 2008/0231389 A1 Sep. 25, 2008

(51) Int. Cl.
*H03H 7/42* (2006.01)
*H01P 3/08* (2006.01)
*H03H 7/38* (2006.01)

(52) U.S. Cl. ............................ 333/26; 333/33; 333/204

(58) Field of Classification Search .................. 333/25, 333/26, 32, 33, 34, 35, 167, 175, 177, 202, 333/204

See application file for complete search history.

(56) References Cited

U.S. PATENT DOCUMENTS 5,534,830 A * 7/1996 Ralph ......................... 333/128
6,133,806 A * 10/2000 Sheen ......................... 333/26
2004/0095212 A1* 5/2004 Iwasaki et al. .............. 333/204
2006/0022773 A1* 2/2006 Iwasaki et al. .............. 333/204

OTHER PUBLICATIONS

Makimoto et al., "Bandpass Filters Using Parallel Coupled Stripline Stepped Impedance Resonators," *IEEE, MTT-28*(12):1413-1417, Dec. 1980.

Sagawa et al., "Geometrical Structures and Fundamental Characteristics of Microwave Stepped-Impedance Resonators," *IEEE, 45*(7):1078-1085, Jul. 1997.

Ang et al., "Analysis and Design of Miniaturized Lumped-Distributed Impedance-Transforming Baluns," *IEEE, 51*(3):1009-1017, 2003.

Yeung et al., "Development of an Integrated LTCC Bluetooth Module," *IEEE*, APMC2005 Proceedings, 2005.

Yeung et al., "An Integrated RF Balanced-Filter with Enhanced Rejection Characteristics," *IEEE*:713-716, 2005.

Yeung et al., "An LTCC Balanced-To-Unbalanced Extracted-Pole Bandpass Filter With Complex Load," *IEEE, 54*(4):1512-1518, Apr. 2006.

* cited by examiner

*Primary Examiner*—Dean O Takaoka
(74) *Attorney, Agent, or Firm*—Seed IP Law Group PLLC

(57) ABSTRACT

A dual band balun filter that includes a first coupled-line section pair provided with a first terminal; a second coupled-line section pair configured to be connected to the first coupled-line section pair, a third coupled-line section pair, and a fourth coupled-line section pair, respectively, and the fourth coupled-line section pair is provided with a second terminal; the third coupled-line section pair is provided with a transmission line and is connected to a fifth coupled-line section pair that is provided with a third terminal; and each of the first to fifth coupled-line section pairs is formed with partial coupled stepped impedance resonators (SIRs).

20 Claims, 8 Drawing Sheets

DUAL BAND COUPLED-LINE BALANCED-TO-UNBALANCED BANDPASS FILTER

BACKGROUND OF THE INVENTION

1. Field of the Invention

The present invention relates to filters, and particularly to a dual-band coupled-line balanced-to-unbalanced bandpass filter with stepped-impedance resonators (SIRs).

2. Description of the Related Art

With the rapid development of wireless communication technologies, radio-frequency (RF) transceivers operating at multiple separated frequency bands are needed. For example, high-speed wireless LANs need to operate at both 2.4 GHz and 5 GHz bands. To this end, devices such as dual band antennas, dual band baluns and dual band filters are gaining wide attention currently.

Among various functional passive devices, filters are considered as one of the most important components, and therefore most of the research efforts have been made upon this particular area, especially upon the configuration of filters that utilize stepped-impedance resonators (SIRs) to achieve dual band features.

Balun is a device for converting a balanced signal to an unbalanced one, or vice versa. A balanced signal consists of two signal components with the same magnitude but 180° out-of-phase. Many analog circuits, such as mixer, amplifier and multiplier, require a balanced input or output to achieve noise or high-order harmonics reduction.

A traditional coupled-line balun is formed of conductive tracks coupled to each other. The balun's operating frequency is conditioned by the line length. A Marchand balun is a symmetrical balun having its coupled lines calculated in $\lambda/4$, where $\lambda$ represents the wavelength corresponding to the central frequency of the passband desired for the balun.

For single band applications, passive devices that combine both filter-type and balun-type functionalities have been proposed in order to miniaturize RF front-end system modules. However, no such device exists for dual band applications.

FIG. 1A shows the architecture of a traditional dual band RF front-end device, which includes a diplexer 800' and two pairs of bandpass filters and baluns 901, 902 and 901', 902', respectively. One pair of bandpass filter and balun is used for one frequency band channel. This known architecture renders a complicated structure at the RF front-end and increases the cost of the related apparatus.

BRIEF SUMMARY OF THE INVENTION

Thus, the present invention provides a dual-band balun bandpass filter.

A dual band balun filter according to the invention includes a first coupled-line section pair provided with a first terminal; a second coupled-line section pair configured to be connected to the first coupled-line section pair, a third coupled-line section pair, and a fourth coupled-line section pair, respectively, wherein the fourth coupled-line section pair is provided with a second terminal; the third coupled-line section pair is provided with a transmission line and connected to a fifth coupled-line section pair that is provided with a third terminal; wherein each of the first to fifth coupled-line section pairs is formed by using a part of stepped impedance resonators (SIRs).

The dual band balun filter as provided in the present invention is capable of simplifying the traditional dual-band RF front-end and in turn will help to reduce the size and cost of a dual band wireless system.

BRIEF DESCRIPTION OF THE SEVERAL VIEWS OF THE DRAWINGS

The features and advantages of the invention will be readily apparent from the following detailed description with reference to the accompanying drawings, wherein.

DETAILED DESCRIPTION OF THE INVENTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures or components or both associated with antennas, baluns, and filters have not been shown or described in order to avoid unnecessarily obscuring descriptions of the embodiments.

Unless the context requires otherwise, throughout the specification and claims that follow, the word "comprise" and variations thereof, such as "comprises" and "comprising" are to be construed in an open inclusive sense, that is, as "including, but not limited to." The foregoing applies equally to the words "including" and "having."

Reference throughout this description to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same embodiment.

Furthermore, the particular features, structures, or characteristics may be combined in any suitable manner in one or more embodiments.

Figure 1A:
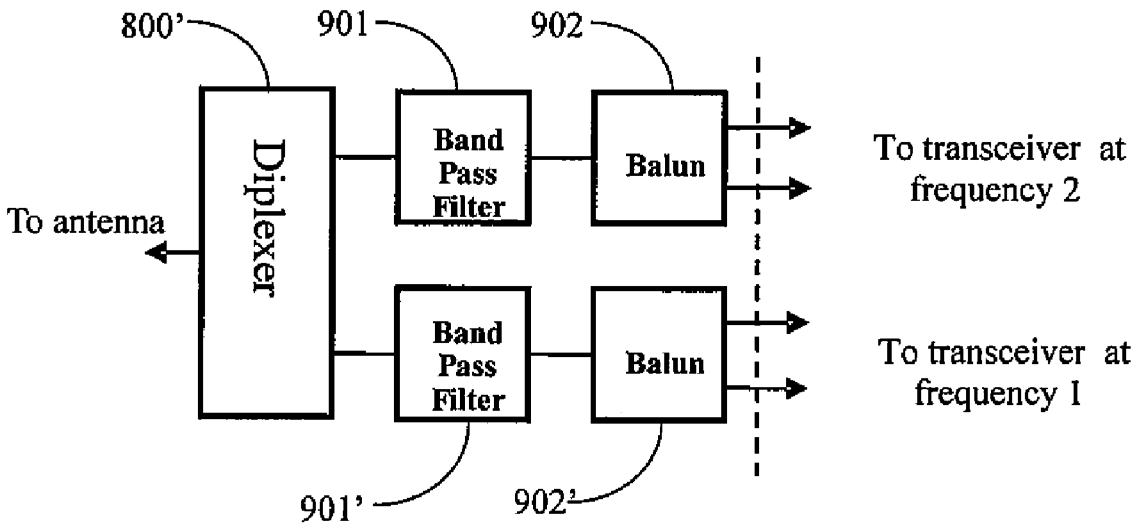
Figure 1A (Prior Art)
FIG. 1A is a schematic diagram showing the architecture of a traditional dual band RF front-end.
Figure 1B:
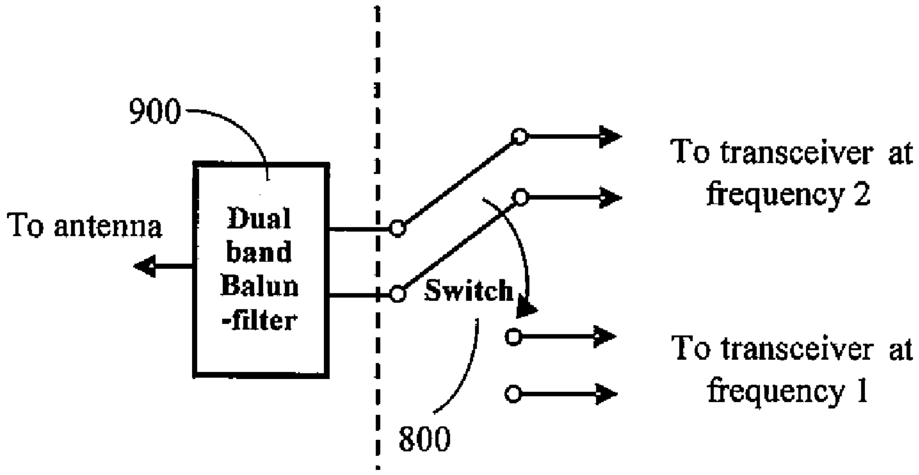
FIG. 1B shows a new architecture of a dual band RF front-end using a novel balun filter of the invention.

FIG. 1B shows the architecture of a dual band RF front-end using a dual band balun filter 900 as proposed in this invention in which the novel dual band balun filter 900 is adopted to replace the separate bandpass filters 901 and 901' of FIG. 1A. The balun filter 900 together with a double-pole single throw switch 800 cooperate with two transceivers (not shown) operating at two different frequencies 1 and 2.

Figure 2:
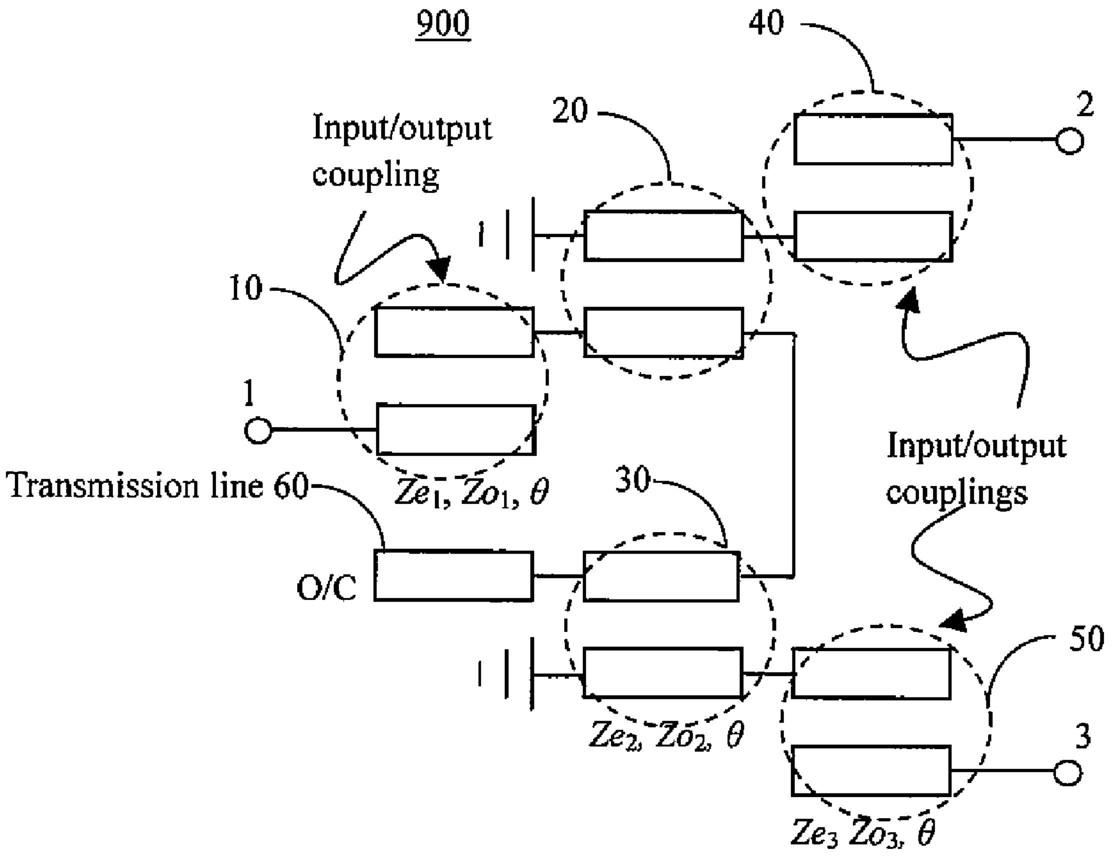
FIG. 2 schematically shows a dual band balun filter according to the invention.

FIG. 2 is a schematic diagram showing an example of the dual band balun filter 900 according to the present invention.

As shown in FIG. 2, the dual band balun filter 900 comprises five coupled-line section pairs 10, 20, 30, 40 and 50, and a single transmission line 60. For those coupled-line section pairs, they are preferably realized by Low Temperature Co-Fired Ceramic (LTCC) multilayered technology, lumped element circuits, or stripline-type format using multilayered substrate technology. However, the present invention should not be limited to the preferable implementation. In this embodiment, each of the coupled-line section pairs includes one pair of partial coupled λ/4-type SIRs.

In detail, the coupled-line section pairs 10, 40 and 50 are input/output couplings with terminals 1, 2 and 3, respectively, wherein the terminal 1 defines an unbalanced port of the dual band balun filter 900 and the terminals 2 and 3 together define a balanced port of the same. The transmission line 60 is connected to one end of the section pair 30 to form an SIR and to an open circuit o/c on the opposing end.

Section pair 20 and section pair 30 are connected to each other. One end of section pair 10 is provided with a terminal 1 and another end of section pair 10 is connected to one end of section pair 20. One end of section pair 40 is provided with a terminal 2 and another end is connected to one end of section pair 20. One end of section pair 50 is provided with a terminal 3 and another end of section pair 50 is connected to one end of section pair 30.

The working mechanism of the dual band balun filter 900 of FIG. 2 will be explained with reference to FIGS. 3A and 3B.

Figure 3A:
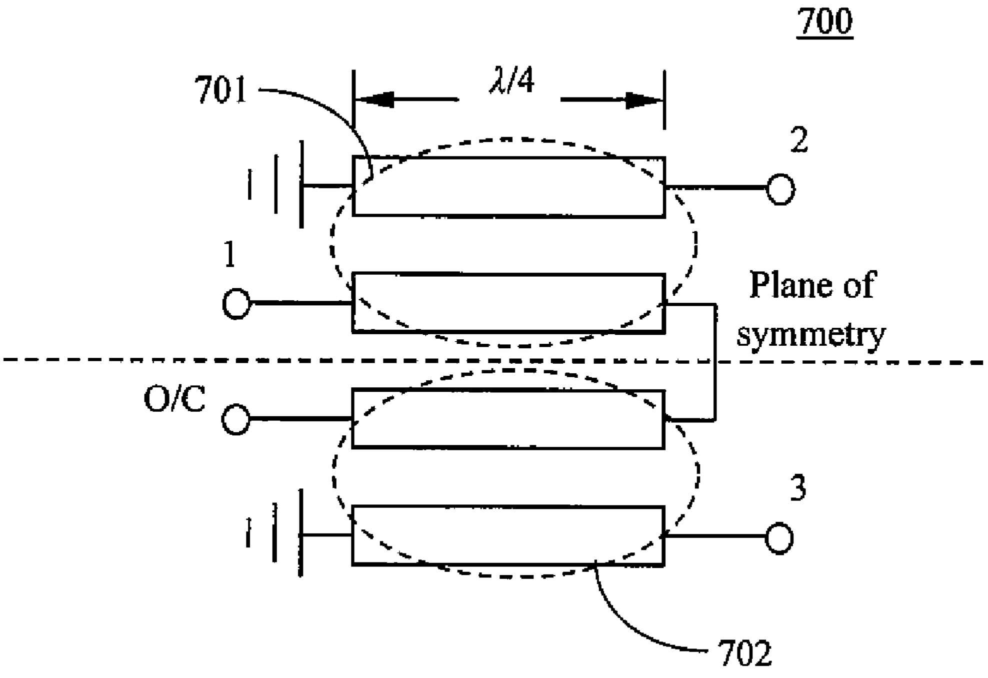
Figure 3A (Prior Art)
FIGS. 3A and 3B are schematic diagrams showing working circuitry for a conventional Marchand balun, and even-mode and odd-mode circuitry of the Marchand balun of the present invention, respectively.

In order to facilitate understanding of the invention, a conventional dual band Marchand balun 700 shown in FIG. 3A will be firstly introduced.

As shown in FIG. 3A, the conventional Marchand balun 700 includes two λ/4 long coupled-line section pairs 701, 702 that are configured to be a symmetrical four-port balun due to the plane of symmetry, where one of the ports may be terminated with an open circuit O/C. The balun has a fairly large bandwidth and good amplitude balance as well as 180° phase difference. Terminal 1 defines an unbalanced port and Terminals 2 and 3 define a balanced port.

With the above port arrangement, S-parameters characterizing an ideal balun operation are given as S21=–S31.

Figure 3B:
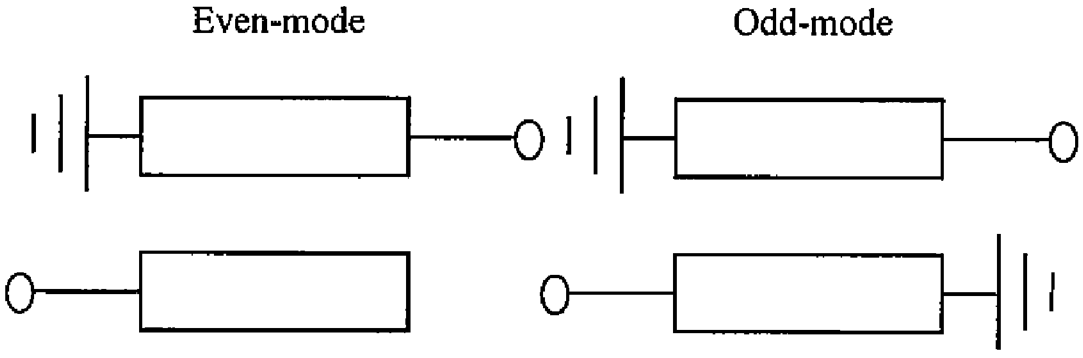

By employing the conventional even- and odd-mode analysis technique, the open circuit terminal is replaced by a load to form a fully symmetrical configuration, as shown in FIG. 3B. As for an ideal Marchand balun, in order to satisfy the relationship among S-parameters, the following condition is required:

$$\frac{T_{even}(1-\Gamma_{odd})}{2-(\Gamma_{even}+\Gamma_{odd})}=0 \tag{1}$$

where $\Gamma_{even}$ and $\Gamma_{odd}$ are the input reflection coefficients of the even-mode and odd-mode circuits, respectively, and $T_{even}$ is the transmission coefficient of the even-mode circuit.

Referring again to FIG. 3B, since the even-mode circuit of an ideal Marchand balun presents a perfect transmission stop ($T_{even}$=0) for all frequencies, it should possess ideal balun-type characteristics (S21=–S31). On the other hand, when considering the return loss (S11), it is sufficient to model just the odd-mode circuit as shown in FIG. 3B.

Figure 4A:
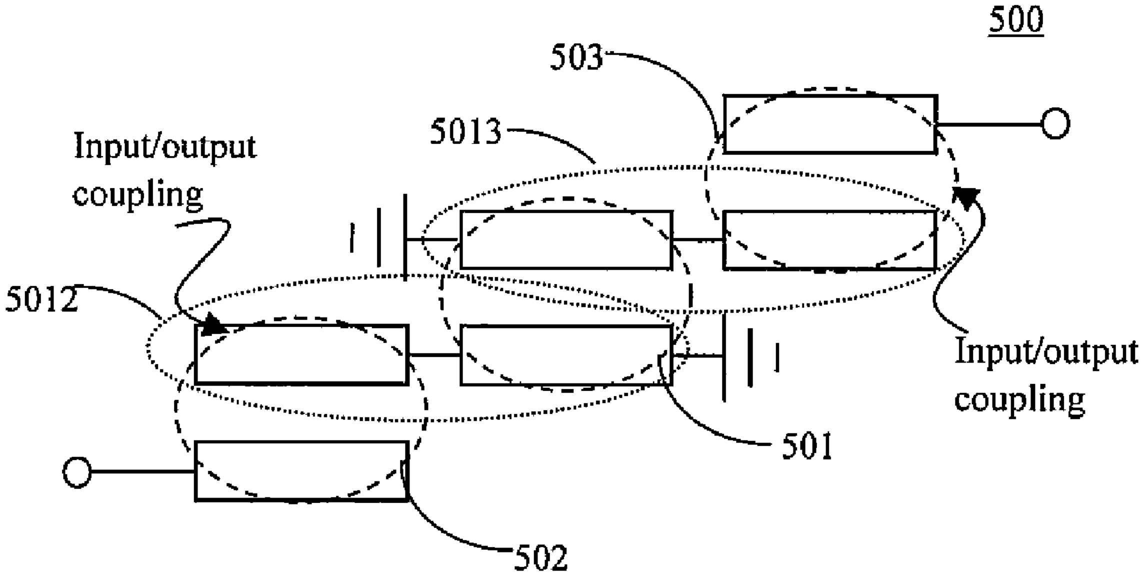
FIG. 4A shows the odd-mode circuit for second order bandpass filtering characteristics according to the invention, and FIG. 4B schematically shows a $\lambda/4$-type stepped Impedance Resonator.

For demonstration purposes and without loss of generality, the odd-mode circuit of a second-order filter 500 is illustrated in the embodiment shown in FIG. 4A. Moreover, for simplicity, the three coupling section pairs are assumed to have the same electrical length θ. Except for the λ/4-type SIRs used in the filter, the method for designing this filter is similar to the conventional one, which was described in an article entitled "Bandpass filters using parallel coupled stripline stepped impedance resonators" (M. Makimoto and S. Yamashita, IEEE Trans. Microwave Theory Tech., vol. 12, no. 12, pp. 1413-1417, December 1980).

Figure 4B:
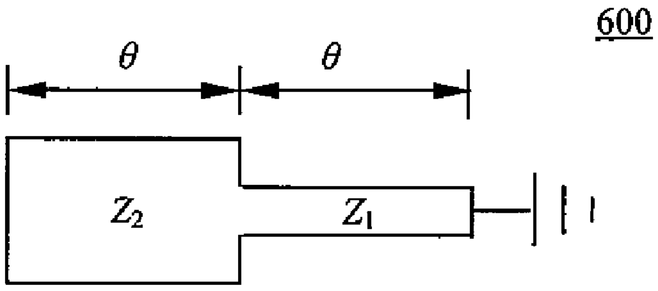

Specifically, the first step is to design a λ/4-type SIR that resonates at a desired frequency. Referring to FIG. 4B, which shows a λ/4-type SIR 600 to be used in this invention, it can be seen that there are three adjustable parameters for the SIR 600: electric length θ, impedance $Z_1$, and impedance $Z_2$ of a coupled line of the electric length θ. The relationships among the three parameters and the first two resonant frequencies are given by the following equations:

$$\frac{f_s}{f_0}=\frac{\pi}{\tan^{-1}\sqrt{R_z}}-1 \tag{2}$$

$$\theta=\tan^{-1}\sqrt{R_z} \tag{3}$$

where $R_z=Z_2/Z_1$ is the impedance ratio. Therefore, when given two desired operating frequencies $f_0$ and $f_s$, the impedance ratio $R_z$ and electrical length θ of the SIR can be obtained.

After obtaining a desired SIR 600, an odd-mode filter can be designed in a way similar to that for conventional dual band coupled-resonator filters, which was described in an article entitled "Coupling dispersion of parallel-coupled microstrip lines for dual-band filters with controllable fractional pass bandwidths" (S. Sun and L. Zhu, IEEE MTT-S International Microwave Symposium Digest, 2005, vol. 3, pp. 2195-2198).

FIG. 4A shows the odd mode circuit of the balun filter 500 as designed according to the present invention, including the first resonator 5012 and the second resonator 5013. Section pairs 502 and 503 are input/output couplings and section pair 501 controls the coupling between the two resonators. In the invention, there are two different types of coupled-line section pairs: the section pair with two open-circuit ports, namely, section pair 502 and section pair 503, and the section pair with two short-circuit ports, namely, section pair 501.

It is known that, when designing a filter, each type of coupled-line section pair should be associated with an equivalent admittance inverter to facilitate the filter design using traditional methods.

Figure 5:
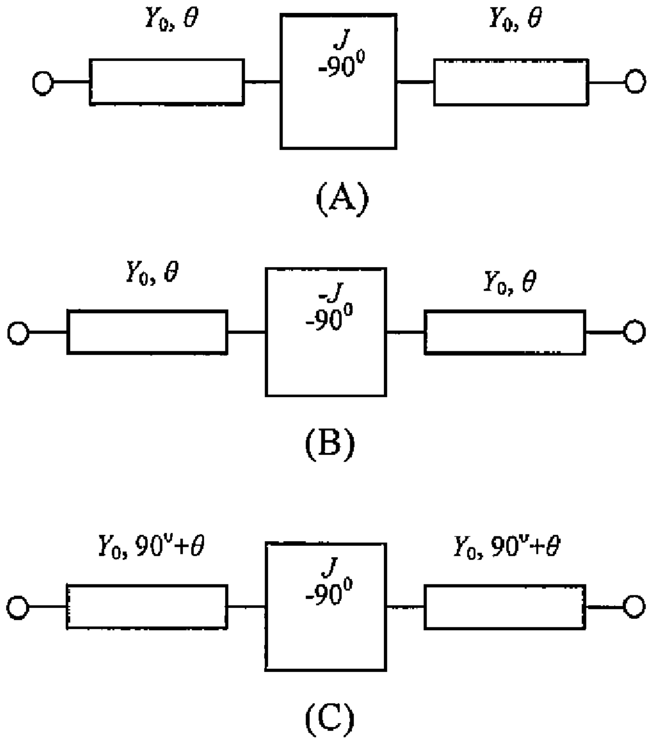
FIGS. 5A-5C show the inverter equivalents for (a) a coupled section with two open-circuit ports; (b) a coupled section with two short-circuit ports; and (c) an alternative representation for the section with two short-circuit ports.

The inverter equivalents for the section pair with open-circuit ports and the one with short-circuit ports are shown in FIG. 5A and FIG. 5B, respectively. The only difference between these two equivalents is the 180° phase-shift (minus sign) between their inverters. However, traditional filter design procedure using inverters requires a λ/2 resonator between any pair of inverters. Therefore, an extra 90° phase-shift is required on either side of the middle inverter to make the overall transmission line length between two adjacent inverters λ/2 long, as shown in FIG. 5C.

The mathematical relationship between a coupled-line section pair and its inverter equivalent circuit can be obtained. For the open-circuit case, the relationship is shown below:

$$\frac{Z_{oe}}{Z_0} = \frac{1 + (J/Y_0)\csc\theta + (J/Y_0)^2}{1 - (J/Y_0)^2\cot^2\theta} \tag{4a}$$

$$\frac{Z_{oo}}{Z_0} = \frac{1 - (J/Y_0)\csc\theta + (J/Y_0)^2}{1 - (J/Y_0)^2\cot^2\theta} \tag{4b}$$

where $Y_0$ is a chosen reference characteristics admittance, $Z_0=1/Y_0$, $Z_{oe}$ and $Z_{oo}$ are the even-mode and odd-mode impedances of a coupled line, respectively, and J is admittance inverter parameter.

For the short-circuit case, the following results could be obtained:

$$\frac{Y_{oe}}{Y_0} = -\frac{1 - (Y_0/J)\csc\theta + (Y_0/J)^2}{1 - (Y_0/J)^2\cot^2\theta} \tag{5a}$$

$$\frac{Y_{oo}}{Y_0} = -\frac{1 + (Y_0/J)\csc\theta + (Y_0/J)^2}{1 - (Y_0/J)^2\cot^2\theta} \tag{5b}$$

where $Y_{oe}$ and $Y_{oo}$ are the even-mode and odd-mode admittances, respectively, and J is admittance inverter parameter.

Up to now, the design of a dual band balun filter can proceed as usual. Herein, a set of prototype element values $g_i$ could be chosen, for both frequency bands, from standard filter design tables, which are known to the skilled in the art and are given in the book entitled "Microwave Filters, Impedance-matching Networks, and Coupling Structures" (G. L. Matthaei, L. Young, and E. M. T. Jones, New York: McGraw-Hill, 1964). If a different set of prototype element values are used for different frequency bands, the dispersion property of coupled lines can be used to control fractional pass bandwidth (referring to the above-mentioned article by S. Sun and L. Zhu).

The admittance inverter parameters J, given a relative bandwidth w, can be expressed as:

$$J_{01} = \sqrt{\frac{Y_0 b_1 w}{g_0 g_1}} = Y_0\sqrt{\frac{w\theta}{g_0 g_1}} \tag{6a}$$

$$J_{j,j+1} = w\sqrt{\frac{b_j b_{j+1}}{g_j g_{j+1}}} = Y_0\frac{w\theta}{\sqrt{g_j g_{j+1}}}, \quad j = 1 \ldots n-1 \tag{6b}$$

$$J_{n,n+1} = \sqrt{\frac{Y_0 b_n w}{g_n g_{n+1}}} = Y_0\sqrt{\frac{w\theta}{g_n g_{+1}}} \tag{6c}$$

where $b_1, b_2, \ldots, b_n$ are the resonator susceptance slope parameters, which could be calculated by:

$$b = \frac{\theta}{Z_0}.$$

Based on the inverter parameters, the design data for all coupled-line section pairs in FIG. 3A can be calculated and an SIR bandpass filter is thus obtained.

Experimentally, it is necessary to apply some extra modifications to a balun-filter. The coupled-line section pair in FIG. 3A will be used as the basic element in the circuit shown in FIG. 2. In particular, $J_{01}$ should be divided by $\sqrt{2}$ because there are two coupled-line section pairs in parallel; the transmission line should be set to the chosen reference impedance $Z_0$ and electrical length of θ; and only a single section pair of same impedance, the low impedance section pair in this case, has coupling for each SIR coupled pair.

The above illustrates how to design a dual band balun filter. Return to FIG. 2, which is a schematic illustration of a dual band balun filter designed according to the invention. As an example, according to the method described above, a set of even-mode and odd-mode impedances has been calculated for a 300-MHz bandwidth, and the designed balun-filter will operate at 2.4-GHz and 5-GHz frequency bands.

These impedances for section pair 10, section pairs 20 and 30, and section pairs 40 and 50 are:

Ze1=86.74Ω, Zo1=36.51Ω,
Ze2=31.35Ω, Zo2=25.25Ω, and
Ze3=72.61Ω, Zo3=38.54Ω.

In addition, the characteristic impedance of the transmission line 60 is $Z_0$=50Ω, and all line section pairs have an electrical length θ of 52.68 degrees according to equations (2) and (3).

Translating those to microstrip-type realizations on a 0.8 mm thick FR4 printed-circuit board (PCB), the corresponding dimensions for each of the coupled-line pairs counted from the left end to the right end of FIG. 2 are:

1st coupled-line pair 10: length=421.48 mil
  width=29.74 mil
  separation=2.75 mil
2nd coupled-line pair 20 or 30: length=386.58 mil
  width=135.09 mil
  separation=20.23 mil
3rd coupled-line pair 40 or 50: length=413.2 mil
  width=41.67 mil
  separation=5.29 mil
Transmission line 60: length=397.99 mil
  width=60.72 mil.

Figure 6:
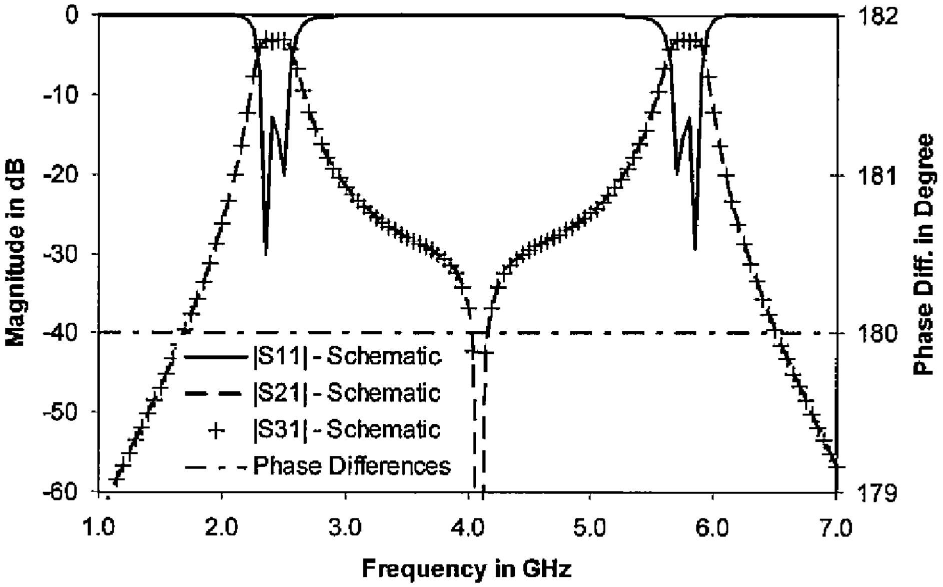
FIG. 6 shows simulated responses of a dual band balun filter based on an ideal transmission line model shown in FIG. 4A.

FIG. 6 shows the schematic-level simulations of this balun-filter using an ideal transmission line model. From FIG. 6, it is seen that the dual band balun filter as designed according to the invention exhibits a good amplitude balance as well as 180° phase difference within the two designed operating frequency bands.

However, the microstrip model shows a significant degradation at the 5-GHz passband due to the unequal even-mode and odd-mode phase velocities. Several existing techniques could be employed to overcome the problem, including the use of a wiggly coupled-line section pair or insertion of a compensating capacitor at the middle of a coupled-line section pair. In this invention, a three-conductor coupled-line section pair is used to alleviate this problem.

Figure 7:
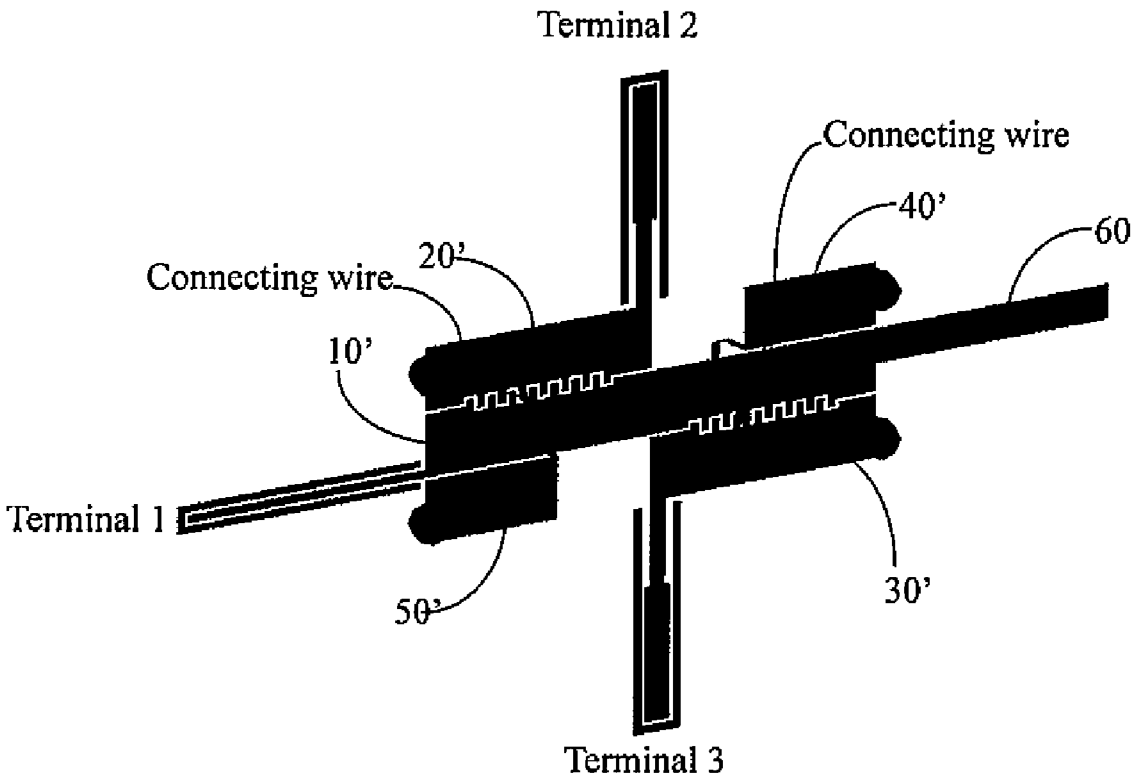
FIG. 7 shows a layout of the dual band balun filter in microstrip-type implementation according to a preferred embodiment of the invention.

FIG. 7 shows the physical layout of the designed balun filter according to the invention. The filter includes five three-conductor coupled-line section pairs 10', 20', 30', 40' and 50' and an open-circuit transmission microstrip line 60. The tooth-like conductor printings at the center two coupled-line section pairs introduce extra odd-mode coupling capacitances. Moreover, for each of these section pairs, a connecting wire is used to connect its two outside microstrips to form a three-conductor coupled-line configuration.

Figure 8A:
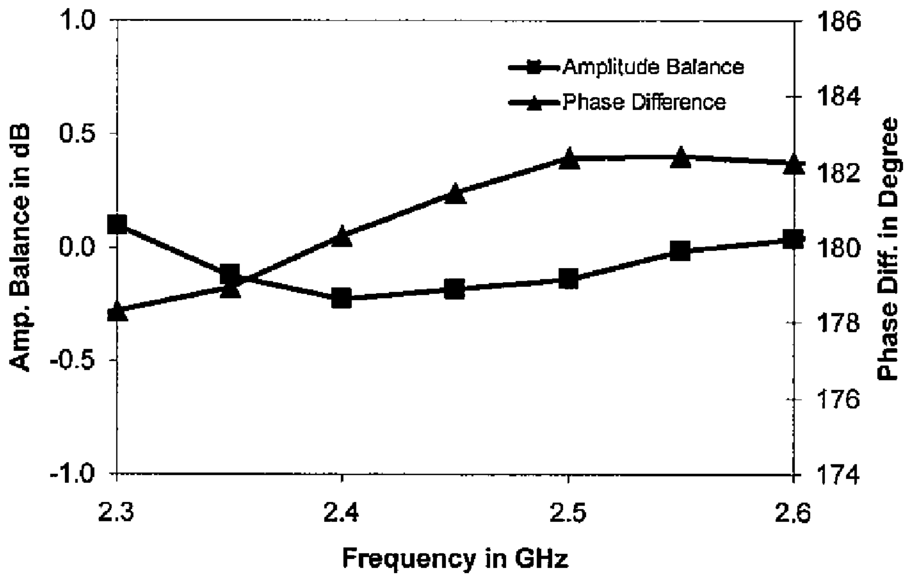
Figure 8A (Prior Art)
FIGS. 8A and 8B show experimental results of the amplitude balance and phase difference of the balun-filter at each operating band.
Figure 8B:
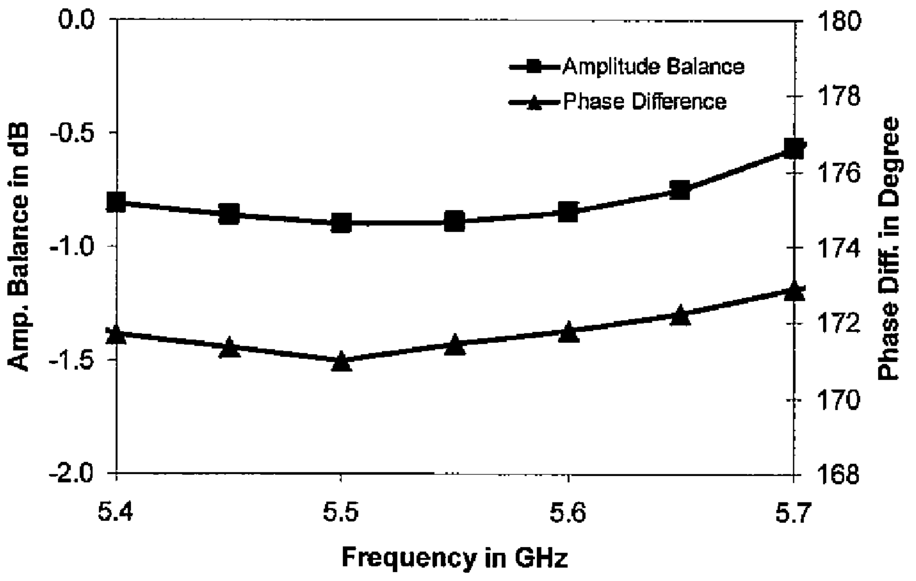
Figure 8B (Prior Art)
Figure 8C:
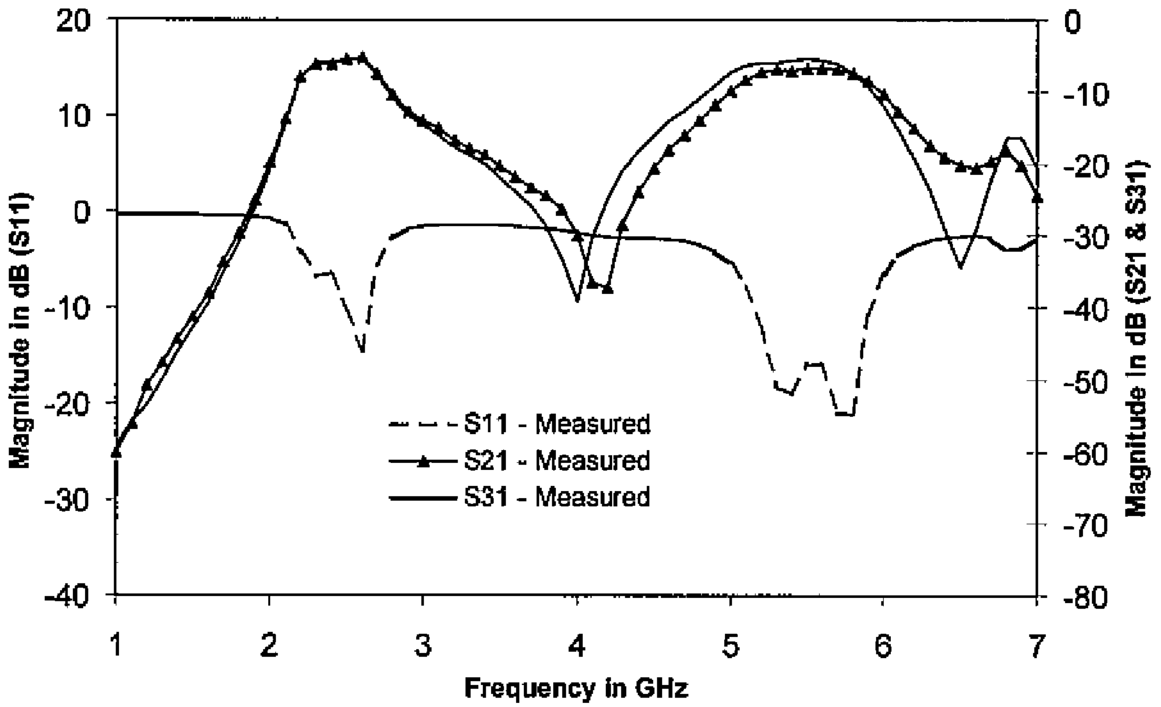
FIG. 8C shows the performances of the dual band balun filter according to the invention.

FIGS. 8A-8C show performance characteristics of the dual band balun filter according to the invention, which are experimental results. It can be seen that this dual band balun filter exhibits satisfactory performances. From FIG. 8A, it can be seen that the 2.4-GHz band has a better performance with an amplitude balance of 0.3-dB maximum and a maximum of 2-degree phase difference. For the 5-GHz band, the corresponding points are 0.9-dB and 9-degree, respectively. Obviously, performance at the 5-GHz band has been degraded by the previously mentioned unequal even and odd mode velocities of microstrip coupled-line section pairs and dispersion effect of the coupled line inverters. The unequal velocity problem can be removed if the circuit is realized by using stripline structures such as LTCC multilayer technologies. The dispersion effect can be minimized by using stripline structures and can be compensated by using a perturbed coupled line structure.

From the above, it is understandable that the invention proposes a new concept of a dual band balanced-to-unbalanced filter that exploits three types of traditional RF components including a coupled-line filter, a Marchand balun, and a stepped-impedance resonator to accomplish a dual band filtering and balun-type operation. The above detailed illustration is for the purpose of exemplifying the concept of the invention. It is understood that the more coupled-line sections are used, the higher order filter characteristics can be achieved.

In addition, the experimental prototype has been realized to validate the proposed concept. Whereas this balun-filter is best implemented in stripline-type format using multi-layer substrate technology, it can also be implemented in traditional PCB technology in microstrip-type format. When implemented in a PCB format, special attention should be paid to the inequality between even-mode and odd-mode velocities of a microstrip coupled-line section pair. This inequality behavior degrades the device's performance. Use of three-conductor coupled-line section pair can alleviate said degradation. In general, this balun-filter serves as a good candidate for multi-band wireless applications such as WLAN transceivers.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A dual band balun filter, comprising a first coupled-line section pair provided with a first terminal; and a second coupled-line section pair configured to be connected to the first coupled-line section pair, a third coupled-line section pair, and a fourth coupled-line section pair, respectively, wherein said fourth coupled-line section pair is provided with a second terminal;

said third coupled-line section pair is provided with a transmission line and connected to a fifth coupled-line section pair that is provided with a third terminal; and each of the first to fifth coupled-line section pairs comprises partial coupled stepped impedance resonators (SIRs).

2. The dual band balun filter according to claim 1, wherein the first terminal of said first coupled-line section pair defines an unbalanced signal port; and the second and third terminals of said fourth and fifth coupled-line section pairs define a balanced signal port.

3. The dual band balun filter according to claim 2, wherein each of the first to fifth coupled-line section pairs satisfies the following conditions:

$$\frac{f_s}{f_0} = \frac{\pi}{\tan^{-1}\sqrt{R_z}} - 1$$

and $$\theta = \tan^{-1}\sqrt{R_z}$$

where $f_s$ and $f_0$ are the two desirable working frequencies of the filter, and $R_Z = Z_2/Z_1$, wherein $Z_2$ and $Z_1$ are the impedances of low and high impedance transmission lines, respectively, of each pair of an SIR with an electrical length θ for each section transmission line.

4. The dual band balun filter according to claim 3, wherein admittance inverter parameters $J_{01}$, $J_{j,j+1}$ and $J_{n,n+1}$ of the filter satisfy the following requirements:

$$J_{01} = \sqrt{\frac{Y_0 b_1 w}{g_0 g_1}} = Y_0\sqrt{\frac{w\theta}{g_0 g_1}}$$

$$J_{j,j+1} = w\sqrt{\frac{b_j b_{j+1}}{g_j g_{j+1}}} = Y_0\frac{w\theta}{\sqrt{g_j g_{j-1}}}, \quad j = 1 \ldots n-1$$

$$J_{n,n+1} = \sqrt{\frac{Y_0 b_n w}{g_n g_{n+1}}} = Y_0\sqrt{\frac{w\theta}{g_n g_{n+1}}}$$

where $Y_0$ is admittance of the SIR; w is a relative bandwidth; $g_0, g_1, \ldots, g_n, g_{n+1}$ are a set of prototype element values; and $b_1, b_2, \ldots, b_n$ are the resonator susceptance slope parameters calculated by $$b = \frac{\theta}{Z_0}.$$

5. The dual band balun filer according to claim 4, wherein each of the first to fifth coupled-line section pairs comprises a stripline-type format using multilayered substrate technology.

6. The dual band balun filer according to claim 4, wherein each of the first to fifth coupled-line section pairs is realized by Low Temperature Co-fired Ceramic (LTCC) multilayered technology.

7. The dual band balun filer according to claim 4, wherein each of the first to fifth coupled-line section pairs is realized by microstrip technology.

8. The dual band balun filer according to claim 4, wherein each of the first to fifth coupled-line section pairs comprises a three-conductor coupled-line section pair.

9. The dual band balun filer according to claim 4, wherein at least one odd-mode coupling capacitance is introduced between two coupled-line section pairs.

10. The dual band balun filter according to claim 4, wherein each of the first to fifth coupled-line section pairs is realized by a lumped element circuit.

11. The dual band balun filter according to claim 4, wherein each of the first to fifth coupled-line section pairs is realized by a perturbed coupled-line structure for controlling the coupling inverter values for each frequency band independently.

12. The dual band balun filter according to claim 4, wherein the second and third coupled-line section pairs correspond to a low impedance section pair of the associated stepped impedance resonators.

13. The dual band balun filter according to claim 10, wherein the lumped element circuit is structured by a multi-layer substrate.

14. A transceiver, comprising:

a dual band balun filter, said dual band balun filter comprising:

a first coupled-line section pair provided with a first terminal; and a second coupled-line section pair configured to be connected to the first coupled-line section pair, a third coupled-line section pair, and a fourth coupled-line section pair, respectively, wherein said fourth coupled-line section pair is provided with a second terminal;

said third coupled-line section pair is provided with a transmission line and connected to a fifth coupled-line section pair that is provided with a third terminal; and each of the first to fifth coupled-line section pairs comprise partial coupled stepped impedance resonators (SIRs).

15. The transceiver according to claim 14, wherein the first terminal of said first coupled-line section pair defines an unbalanced signal port; and the second and third terminals of said fourth and fifth coupled-line section pairs, respectively, define a balanced signal port.

16. The transceiver according to claim 15, wherein each of the first to fifth coupled-line section pairs satisfies the following conditions:

$$\frac{f_s}{f_0} = \frac{\pi}{\tan^{-1}\sqrt{R_2}} - 1$$

and

-continued $$\theta = \tan^{1}\sqrt{R_2}$$

where $f_s$ and $f_0$ are the two desirable working frequencies of the filter, and $R_2=Z_2,Z_1$, wherein $Z_2$ and $Z_1$ are the impedances of low and high impedance transmission lines, respectively, of each pair of an SIR with an electrical length θ for each section transmission line.

17. The transceiver according to claim 16, wherein admittance inverter parameters $J_{01}$, $J_{j,j+1}$ and $J_{n,n+1}$ of the filter satisfy the following requirements:

$$J_{01} = \sqrt{\frac{Y_0 b_1 w}{g_0 g_1}} = Y_0\sqrt{\frac{w\theta}{g_0 g_1}}$$

$$J_{j,j+1} = w\sqrt{\frac{b_j b_{j+1}}{g_j g_{j+1}}} = Y_0\frac{w\theta}{\sqrt{g_j g_{j+1}}}, \quad j = 1 \ldots n-1$$

$$J_{n,n+1} = \sqrt{\frac{Y_0 b_n w}{g_n g_{n+1}}} = Y_0\sqrt{\frac{w\theta}{g_n g_{n+1}}}$$

where $Y_0$ is admittance of the SJR; w is a relative bandwidth; $g_0, g_1, \ldots, g_0, g_{n+1}$ are a set of prototype element values; and $b_1, b_2, \ldots, b_n$ are the resonator susceptance slope parameters calculated by $$b = \frac{\theta}{Z_0}.$$

18. The transceiver according to claim 17, wherein each of the first to fifth coupled-line section pairs comprises a strip-line-type format using multilayered substrate technology.

19. The transceiver according to claim 17, wherein each of the first to fifth coupled-line section pairs comprises a three-conductor coupled-line section pair.

20. The transceiver according to claim 17, wherein at least one odd-mode coupling capacitance is introduced between two coupled-line section pairs.

* * * * *

UNITED STATES PATENT AND TRADEMARK OFFICE
CERTIFICATE OF CORRECTION

PATENT NO. : 7,541,888 B2
APPLICATION NO. : 11/690393
DATED : June 2, 2009
INVENTOR(S) : Ke-Li Wu et al.

It is certified that error appears in the above-identified patent and that said Letters Patent is hereby corrected as shown below:

Column 8

Line 39, " $J_{j,j+1} = w\sqrt{\frac{b_j b_{j+1}}{g_j g_{j+1}}} = Y_0 \frac{w\theta}{\sqrt{g_j g_{j-1}}}, \quad j = 1 \cdots n-1$ " should read as, -- $J_{j,j+1} = w\sqrt{\frac{b_j b_{j+1}}{g_j g_{j+1}}} = Y_0 \frac{w\theta}{\sqrt{g_j g_{j+1}}}, \quad j = 1 \cdots n-1$ --.

Signed and Sealed this

Sixteenth Day of March, 2010

David J. Kappos
*Director of the United States Patent and Trademark Office*